(12) United States Patent
Shinoda et al.

(10) Patent No.: US 8,106,312 B2
(45) Date of Patent: Jan. 31, 2012

(54) SEALING STRUCTURE, ELECTRONIC DEVICE, SEALING METHOD, GASKET, AND MANUFACTURING METHOD THEREOF

(75) Inventors: Takao Shinoda, Kawasaki (JP); Shingo Yamaguchi, Kawasaki (JP); Hidehiko Hizuka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/636,188

(22) Filed: Dec. 11, 2009

(65) Prior Publication Data

US 2010/0089638 A1   Apr. 15, 2010

Related U.S. Application Data

(63) Continuation of application No. PCT/JP2007/064377, filed on Jul. 20, 2007.

(51) Int. Cl.
*H01L 23/045* (2006.01)
*H01L 23/055* (2006.01)

(52) U.S. Cl. ......... 174/554; 174/564
(58) Field of Classification Search ........... 174/50, 174/564, 50.64, 63, 60, 481, 554
See application file for complete search history.

(56) References Cited

U.S. PATENT DOCUMENTS

| | | | | |
|---|---|---|---|---|
| 5,247,424 | A * | 9/1993 | Harris et al. | 361/704 |
| 5,406,027 | A * | 4/1995 | Matsumoto et al. | 174/546 |
| 5,491,300 | A * | 2/1996 | Huppenthal et al. | 174/151 |
| 6,484,016 | B1 * | 11/2002 | Cheon | 455/90.1 |
| 7,251,512 | B2 * | 7/2007 | Komiyama | 455/575.3 |
| 8,003,898 | B2 * | 8/2011 | Hayashi et al. | 174/385 |
| 2002/0098736 | A1 * | 7/2002 | Hattori et al. | 439/587 |
| 2004/0157481 | A1 * | 8/2004 | Watanabe | 439/165 |
| 2006/0032653 | A1 | 2/2006 | Minoshima et al. | |
| 2006/0185881 | A1 | 8/2006 | Minoshima et al. | |

FOREIGN PATENT DOCUMENTS

| | | |
|---|---|---|
| JP | 6-23123 U | 3/1994 |
| JP | 2003-142836 A | 5/2003 |
| JP | 2004-135012 * | 4/2004 |
| JP | 2006-093510 A | 4/2006 |
| JP | 3127071 U | 11/2006 |
| WO | 03/085793 A1 | 10/2003 |

OTHER PUBLICATIONS

Notification of Transmittal of Translation of the International Preliminary Report on Patentability (Form PCT/IB/338) of International Application No. PCT/JP2007/064377 mailed Feb. 18, 2010 with form PCT/ISA/237.
International Search Report and Written Opinion for PCT/JP2007/064377, mailing date of Aug. 21, 2007.
Chinese Office Action dated Apr. 28, 2011, issued in corresponding Chinese Patent Application No. 200780053610.6 (English translation with of relevant portions).
Korean Office Action dated Apr. 23, 2011, issued in corresponding Korean Patent Application No. 10-2009-7026042. (English translation with of relevant portions).
Japanese Office Action dated Sep. 20, 2011, issued in corresponding Japanese Patent Application No. 2009-524326 (Partial English translation).

\* cited by examiner

*Primary Examiner* — Hung Ngo
(74) *Attorney, Agent, or Firm* — Westerman, Hattori, Daniels & Adrian, LLP

(57) ABSTRACT

A sealing structure to seal housings includes a sealing member disposed between housings to be bonded to allow penetration of at least one signal line; and an adhesive material disposed between the signal lines penetrating the sealing member to bond the signal lines to be overlapped.

13 Claims, 24 Drawing Sheets

SEALING STRUCTURE, ELECTRONIC DEVICE, SEALING METHOD, GASKET, AND MANUFACTURING METHOD THEREOF

This application is a continuation of International Application No. PCT/JP2007/064377, filed on Jul. 20, 2007, now pending, herein incorporated by reference.

FIELD

The embodiments discussed herein are related to a sealing structure that seals housings of various electronic devices such as portable apparatuses and, for example, to a sealing structure, an electronic device, a sealing method, a gasket, which seal housings while allowing passage of a signal line such as a flat cable, and a manufacturing method thereof.

BACKGROUND

For an electronic device such as a portable terminal apparatus, a housing thereof may be foldably configured by coupling a housing unit on the operation side and a housing unit on the display side with a hinge unit to enhance operationality and portability. In such a case, circuit substrates individually disposed on the housing units must be connected by a signal line and a sealing structure disposed with an O-ring, etc., is individually used for each of the housing units.

For such a sealing structure, Japanese Laid-Open Patent Publication No. 2006-93510 discloses an electronic apparatus including a stationary side housing and a moving side housing which are foldably coupled to each other and electronic components in the housings connected by a flexible cable (Abstract, FIG. 1, etc.). In this electronic apparatus, a cable case is mounted on an insertion opening formed for allowing passage of a flexible cable through a gasket; a flexible cable is mounted through an insertion hole formed in the cable case; a spacer is attached to the flexible cable; and a space formed between the flexible cable and an inner wall of the insertion hole by this spacer is defined as a seal agent receiving space to fill this space with a seal agent.

International Publication Pamphlet No. WO03/085793 A1 discloses that a sealing is formed by filing a gap to be sealed with liquid rubber for a sealing structure including a flat cable (Abstract, FIG. 1, etc.).

The sealing structure disclosed in Japanese Laid-Open Patent Publication No. 2006-93510 has the gasket and a signal line separated between the housings and has a configuration sealing the cable cover and the signal line by inserting the signal line through the insertion hole provided in a rising wall of the housing and disposing the cable cover using elastomer and an O-ring for a gap between the insertion hole and the signal line, and the disposition of the cable cover requires a process of sealing a gap between the cable and the housing with a seal agent.

The sealing structure using the cable and rubber (International Publication Pamphlet No. WO03/085793 A1) must force passage of a plurality of signal lines in the case of advanced electronic devices with improved functions and may not support such a case.

To electronic devices such as portable terminal apparatuses, various requests are made such as a request for sealing performance such as high-level waterproof due to expanded use environment, miniaturization in association with portability and operationality, increase in complexity of signal lines between housings due to higher functionality such as a communication function and an information processing function, and reduction in cost for dissemination and such a request is also made for a sealing structure.

If the sealing structure and the miniaturization of electronic devices are attempted to be implemented with the configuration disclosed in Japanese Laid-Open Patent Publication No. 2006-93510, the thickness of the housing is increased due to the intervention of the thicknesses of the signal line, the sealing, the cable case, and the O-ring in the housing thickness direction because the connector cover is disposed between the housing members and, in the cable width direction, a connector unit of the signal line must pass through the cable cover and the occupied width consists of the coupling portion width corresponding to the number of the signal lines, the sealing width on the edge sides of the signal lines, the wall thickness of the cable case, and the O-ring thickness. Therefore, the sealing structure causes an obstacle for the miniaturization of the apparatus.

If the sealing is achieved around the signal line, the sealing processing is delayed by the operation of applying the seal agent and the drying time of the seal agent, reducing the productivity of devices. If a plurality of cables are used, a spacer must be mounted and a retaining operation thereof is added.

The sealing process requires filling of the seal agent for the cable and the cable cover at the same time and such an operation is complicated and reduces the workability.

Such problems occur not only in the configuration disclosed in Japanese Laid-Open Publication No. 2006-93510 but also in electronic devices including portable terminal apparatuses, etc.

Such problems are not disclosed and a means for solving the problems is not disclosed or indicated in Japanese Patent Application Laid-Open Publication No. 2006-93510 and International Publication Pamphlet No. WO03/085793 A1.

SUMMARY

According to an aspect of the present invention, a sealing structure to seal housings includes a sealing member disposed between housings to be bonded to allow penetration of at least one signal line, and an adhesive material disposed between the signal lines penetrating the sealing member to bond the signal lines to be overlapped.

According to another aspect of the present invention, an electronic device includes a housing unit to include a first housing and a second housing bonded with the first housing, a circuit unit disposed in the housing unit, a first cable and a second cable connected to the circuit unit and drawn out of the housing unit, a sealing member provided between the first housing and the second housing and penetrated by the first cable and the second cable, and an adhesive material provided between the first cable and the second cable to bond the first cable and the second cable to be overlapped.

According to further aspect of the present invention, a sealing method to seal housings includes overlapping signal lines to be disposed between housings to bond the signal lines with an adhesive material, and allowing penetration of the bonded signal lines through a sealing member to dispose the sealing member between the housings.

According to further aspect of the present invention, a manufacturing method of a gasket to seal housings includes disposing an adhesive material between signal lines in an overlapped manner to bond the signal lines, and forming a sealing member allowing penetration of the bonded signal lines.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

Other objects, features, and advantages of the present invention will become more apparent by reference to the accompanying drawings and embodiments.

DESCRIPTION OF THE PREFERRED EMBODIMENTS

According to an aspect of embodiments of the present invention, a sealing member bonding housings allows penetration of signal lines and the signal lines are overlapped and bonded by an adhesive material. That is, the overlapped signal lines are sealed by the adhesive material located therebetween and a circumferential portion of the signal lines is sealed by the sealing member. Therefore, housings for making up a housing unit allow passage of the signal lines and are sealed by the sealing member and the adhesive material.

First Embodiment

Figure 1:
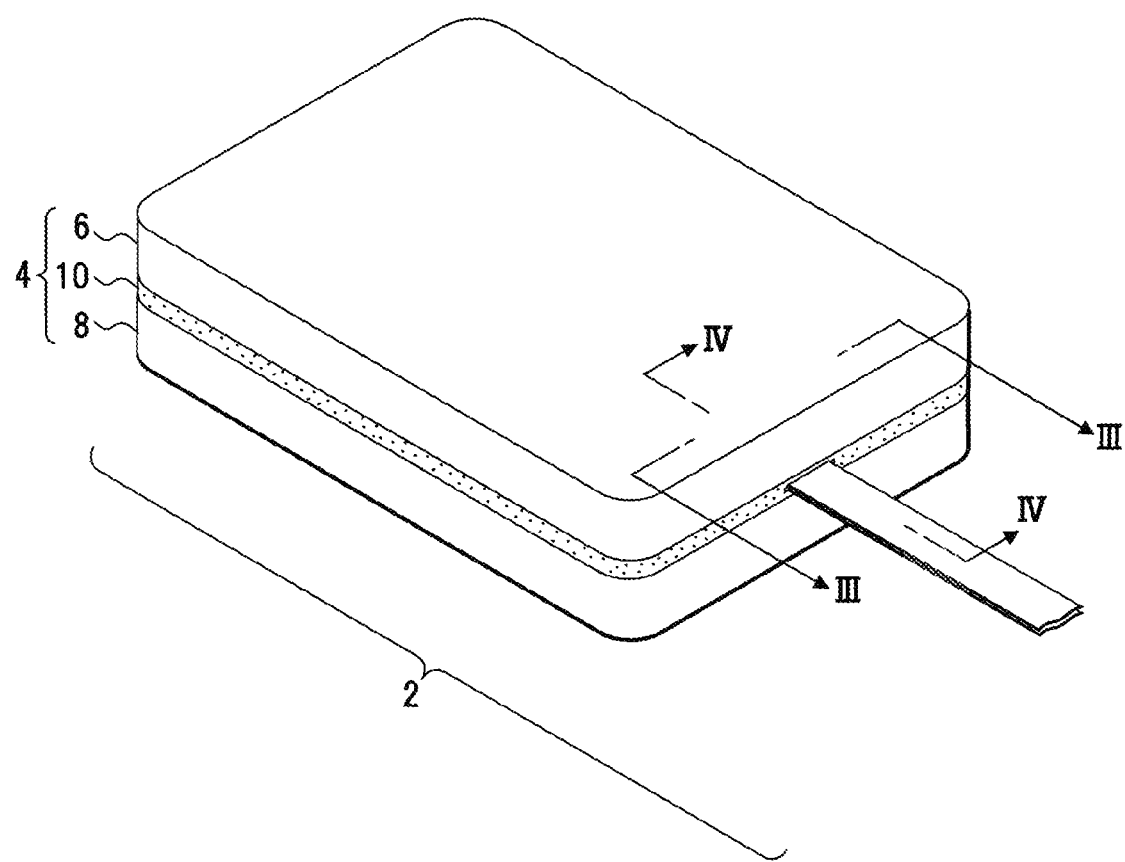
FIG. 1 is a diagram of a sealing structure of an electronic device according to a first embodiment.

A first embodiment of the present invention will be described with reference to FIGS. 1 and 2. FIG. 1 is a perspective view of an electronic device and FIG. 2 is an exploded perspective view of the electronic device.

An electronic device 2 is an example of a device that must prevent moisture and dust from entering from the outside and is, for example, a portable apparatus such as a portable terminal apparatus. As depicted in FIG. 1, the electronic device 2 includes a case unit 4 as a housing unit, an upper case 6 as a first housing, and a lower case 8 as a second housing and the case unit 4 is made up by bonding the upper case 6 and the lower case 8. To seal the case unit 4, a gasket 10 is included as a sealing member that seals the cases. The gasket 10 has, for example, a circumferential shape configured for the shape of the bonding surfaces of the upper case 6 and the lower case 8 and is made of a flexible material such as rubber having elasticity and air-tightness.

Figure 2:
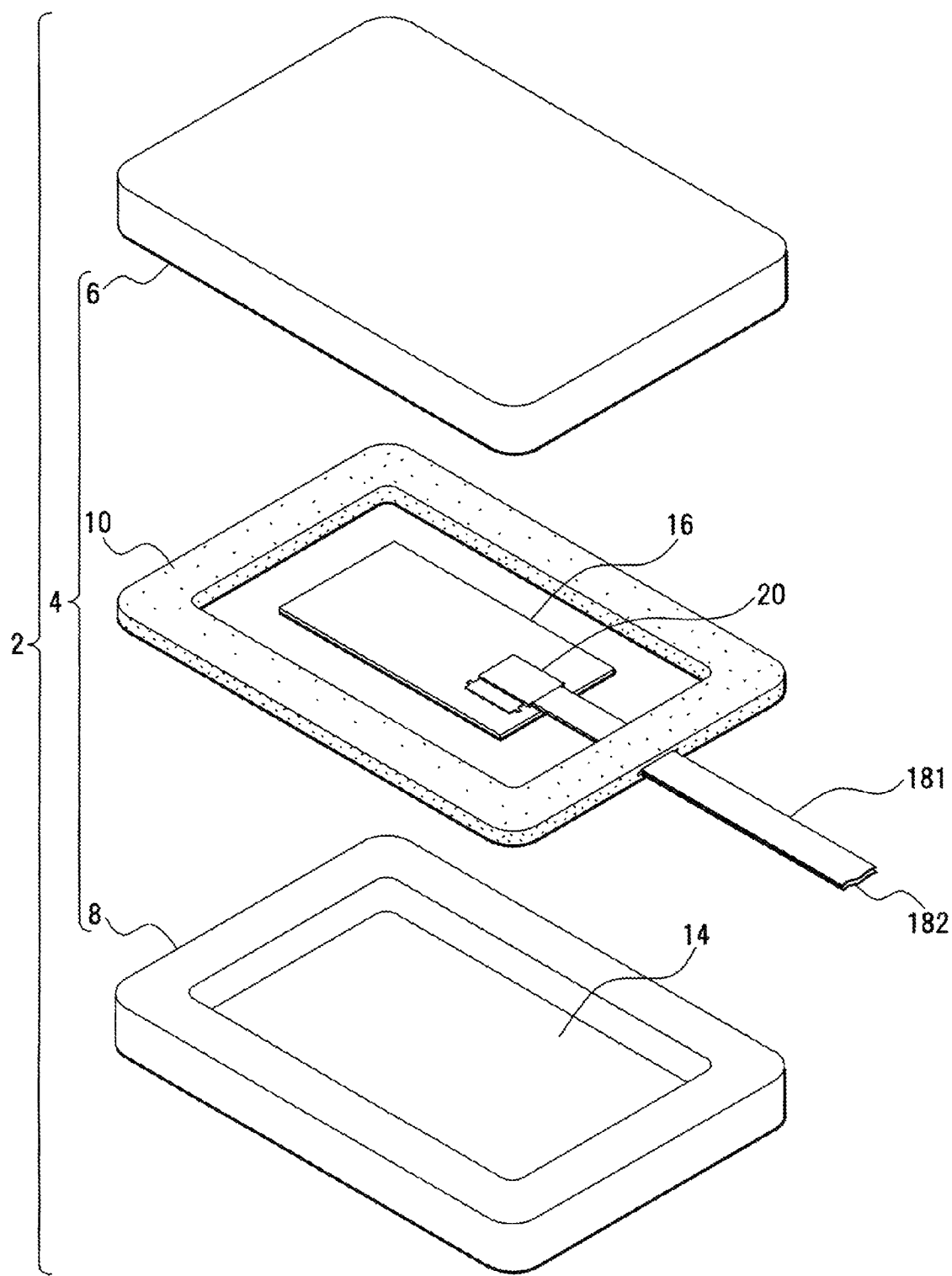
FIG. 2 is an exploded perspective view of the sealing structure of the electronic device.

As depicted in FIG. 2, an internal space 14 of the case unit 4 is disposed with a circuit unit, for example, a circuit substrate 16 equipped with a functional unit of the electronic device 2 and the circuit substrate 16 is connected to at least two signal lines or plate-shaped signal lines, which are a flexible cable 181 as a first cable and a flexible cable 182 as a second cable. The flexible cables 181 and 182 are connected to the circuit substrate 16 by connection through a connector 20 or direct connection and are drawn out of the case unit 4 through the gasket 10 and connected to another functional unit of the electronic device or another electronic device not depicted outside of the case unit 4. Therefore, the electronic device 2 has a sealing property maintained by a sealing structure including the gasket 10 and allows penetration of the flexible cables 181 and 182 to enable electric connection with the outside and giving and receiving of signals.

Figure 3:
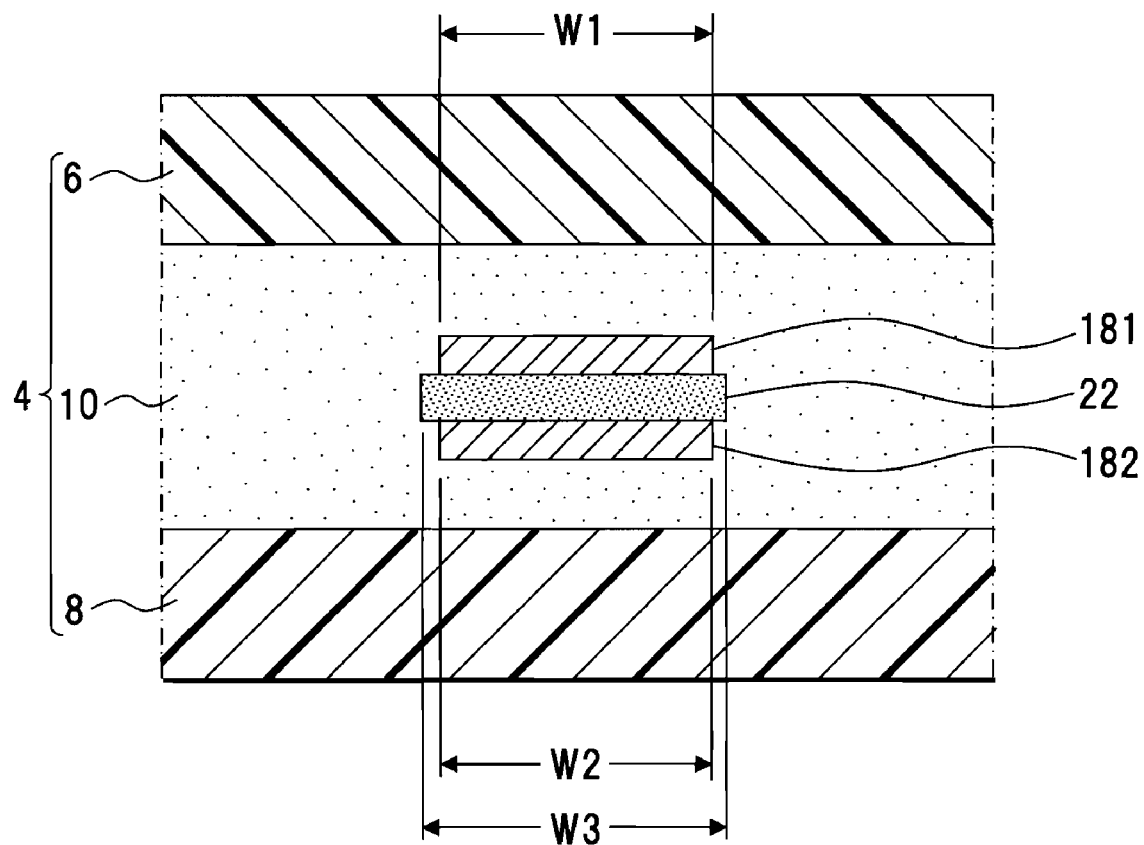
FIG. 3 is a cross-section diagram taken along line III-III of FIG. 1.
Figure 4:
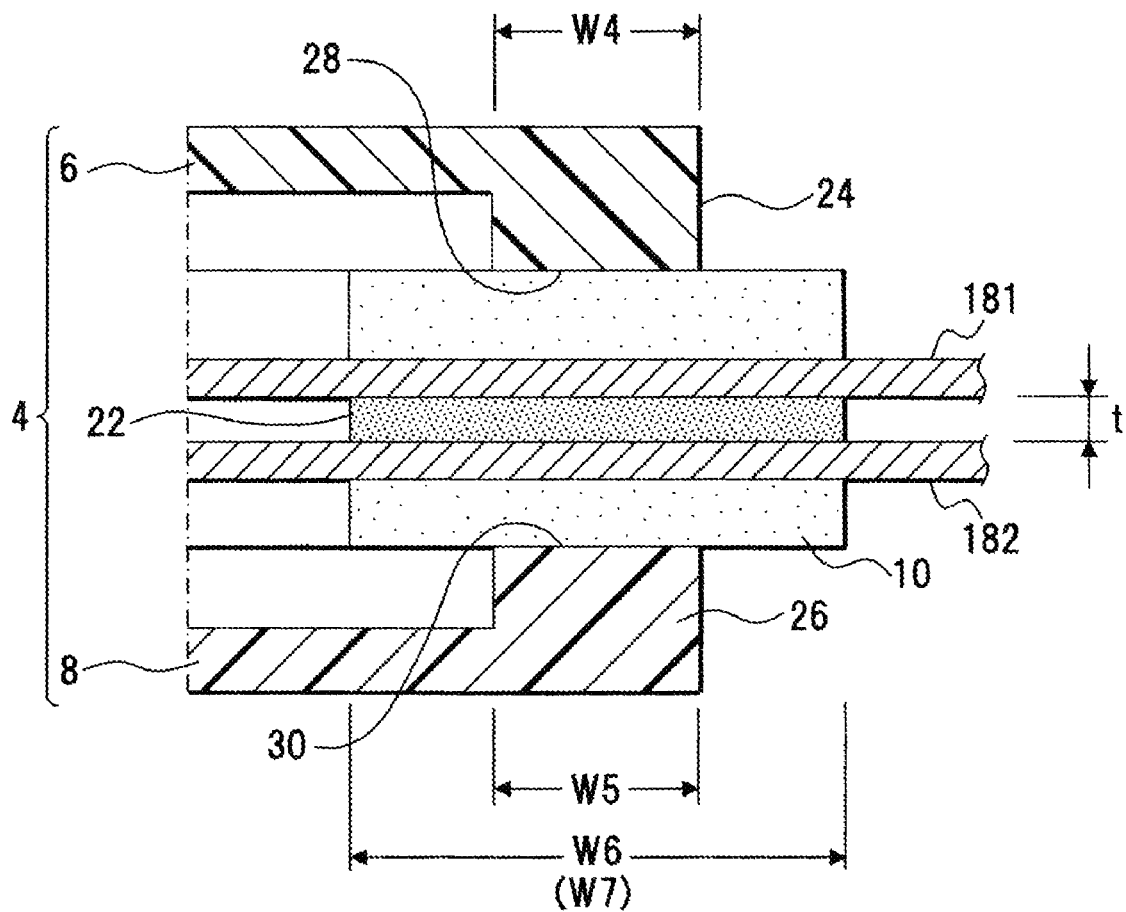
FIG. 4 is a cross-section diagram taken along line IV-IV of FIG. 1.

The sealing structure of the electronic device 2 will be described with reference to FIGS. 3 and 4. FIG. 3 is a cross-section diagram taken along line III-III of FIG. 1 and FIG. 4 is a cross-section diagram taken along line IV-IV of FIG. 1. In FIGS. 3 and 4, the portions same as FIGS. 1 and 2 are denoted by the same reference numerals.

As depicted in FIG. 3, this sealing structure includes the flexible cables 181 and 182 as at least two signal lines overlapped and disposed with a double-faced adhesive seat 22 as an adhesive material and integrated by the double-faced adhesive seat 22. A circumferential portion of the flexible cables 181 and 182 and, an exposed portion of the double-faced adhesive seat 22 exposed between the flexible cables 181 and 182 are covered by the gasket 10. As depicted in FIG. 4, a rising wall 24 of the upper case 6 overlaps the gasket 10 on the upper surface side; a rising wall 26 of the lower case 8 overlaps the gasket 10 on the lower surface side; end surfaces 28 and 30 of the rising walls 24 and 26 are in close contact with the gasket 10 to retain air-tightness between the gasket 10 and the case unit 4.

When W1 and W2 denote the respective widths of the flexible cables 181 and 182 and W3 denotes the width of the double-faced adhesive seat 22, since W1 and W2 of the flexible cables 181 and 182 are the same widths (W1=W2) in this embodiment and the width W3 of the double-faced adhesive seat 22 is set greater than the width W1(=W2) {W3>W1 (=W2)}, the edges of the double-faced adhesive seat 22 is projected from the edges of the flexible cables 181 and 182. In this case, the widths may be set to {W3≦W1(=W2)}.

When W4, W5, W6 and W7 denote the width of the rising wall 24 of the upper case 6, the width of the rising wall 26 of the lower case 8, the width of the gasket 10, and the lateral width of the double-faced adhesive seat 22, respectively, the widths W4 and W5 of the rising walls 24 and 26 are set to be the same (W4=W5) and the width W6 of the gasket 10 is set greater than the widths W4 and W5 of the rising walls 24 and 26 {W6>W4 (=W5)} in this embodiment. The lateral width W7 of the double-faced adhesive seat 22 is set to the same as the width W6 of the gasket 10 (W6=W7) and this setting maintains a distance t between the flexible cables 181 and 182 in the gasket 10 to a constant width depending on the thickness of the double-faced adhesive seat 22, for example, on the order of [mm] and prevents the flexible cables 181 and 182 peeling off from the gasket 10.

Since such a sealing structure enables bonding portions of the signal lines to be positioned at integrated portions of the signal lines and the sealing member or the gasket, the occupying dimensions of the signal lines may be minimized in the width direction and the thickness direction for the gasket 10, which is the sealing member, and a proportion of a sealing portion to the electronic device 2 may be reduced, which contributes to the miniaturization and the flattening of the electronic device 2.

A sealing structure and a sealing method of the case unit 4 or a manufacturing method of the gasket 10 will then be described with reference to FIGS. 5A to 5D. FIGS. 5A to 5D depict an example of process steps of the sealing method and the manufacturing method of the gasket 10. In FIGS. 5A to 5D, the portions same as FIGS. 1, 2, 3 and 4 are denoted by the same reference numerals.

This sealing method includes a bonding step of the flexible cables 181 and 182, a forming step of the gasket 10 as the sealing member and an integrating step of the flexible cables 181 and 182, and a sealing step of the case unit 4, and the manufacturing method of the gasket includes the forming step of the gasket 10 after the bonding step of the flexible cables 181 and 182.

a) Bonding Step of Flexible Cables 181 and 182

Figure 5A:
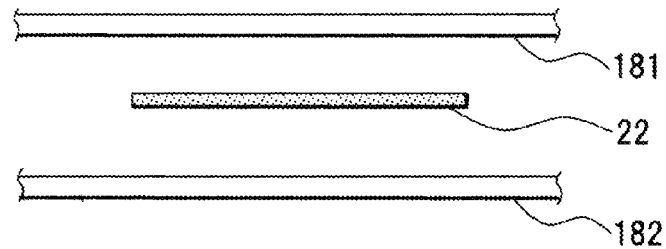
FIGS. 5A to 5D are diagrams of a sealing method of the electronic device.
Figure 5B:
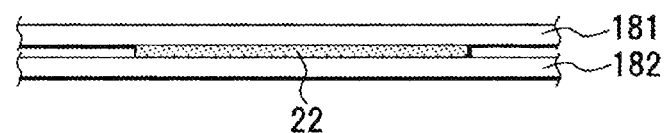

As depicted in FIG. 5A, the double-faced adhesive seat 22 acting as an adhesive material is overlapped between the flexible cable 181 and the flexible cable 182 and, as depicted in FIG. 5B, the flexible cables 181 and 182 are integrated by the double-faced adhesive seat 22.

b) Forming Step of Gasket 10 and Integrating Step of Flexible Cables 181 and 182

Figure 5C:
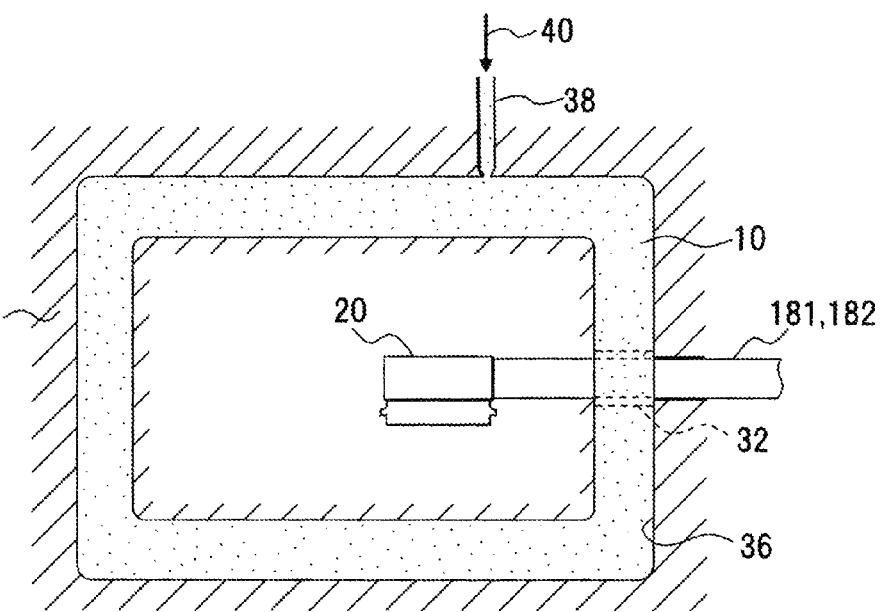
Figure 5D:
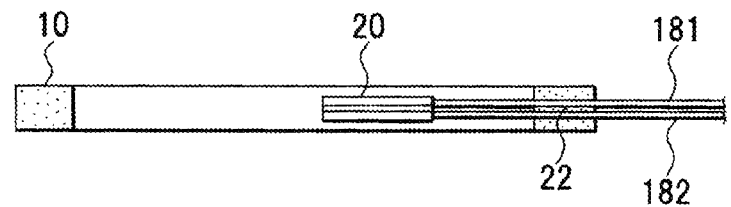

As depicted in FIG. 5C, the integrated at least two flexible cables 181 and 182 are located with a bonding portion 32 thereof positioned at a cavity 36 of a forming mold 34 and a gasket material 40 is poured into the inside of the cavity 36 from a port 38 to form the gasket 10. As a result, as depicted in FIG. 5D, the formed gasket 10 and the flexible cables 181 and 182 form into an integral structure.

With such a forming process, the gasket 10 and a plurality of the flexible cables 181 and 182 are easily integrated and the flexible cables 181 and 182 penetrate through the gasket 10 at the bonding portion 32.

c) Sealing Step of Case Unit 4

As depicted in FIG. 2, the circuit substrate is connected to the connector 20 side of the flexible cables 181 and 182; the gasket 10 is sandwiched between the upper case 6 and the lower case 8; and the air-tightness of the case unit 4 is retained by the gasket 10 as the case unit 4 is assembled.

The air-tightness capable of preventing the entry of water, dust, etc., is retained between the gasket 10 and the flexible cables 181 and 182 by the bonding with the double-faced adhesive seat 22 and the bonding of the flexible cables 181 and 182 and the double-faced adhesive seat 22 with the gasket 10.

Second Embodiment

Figure 6:
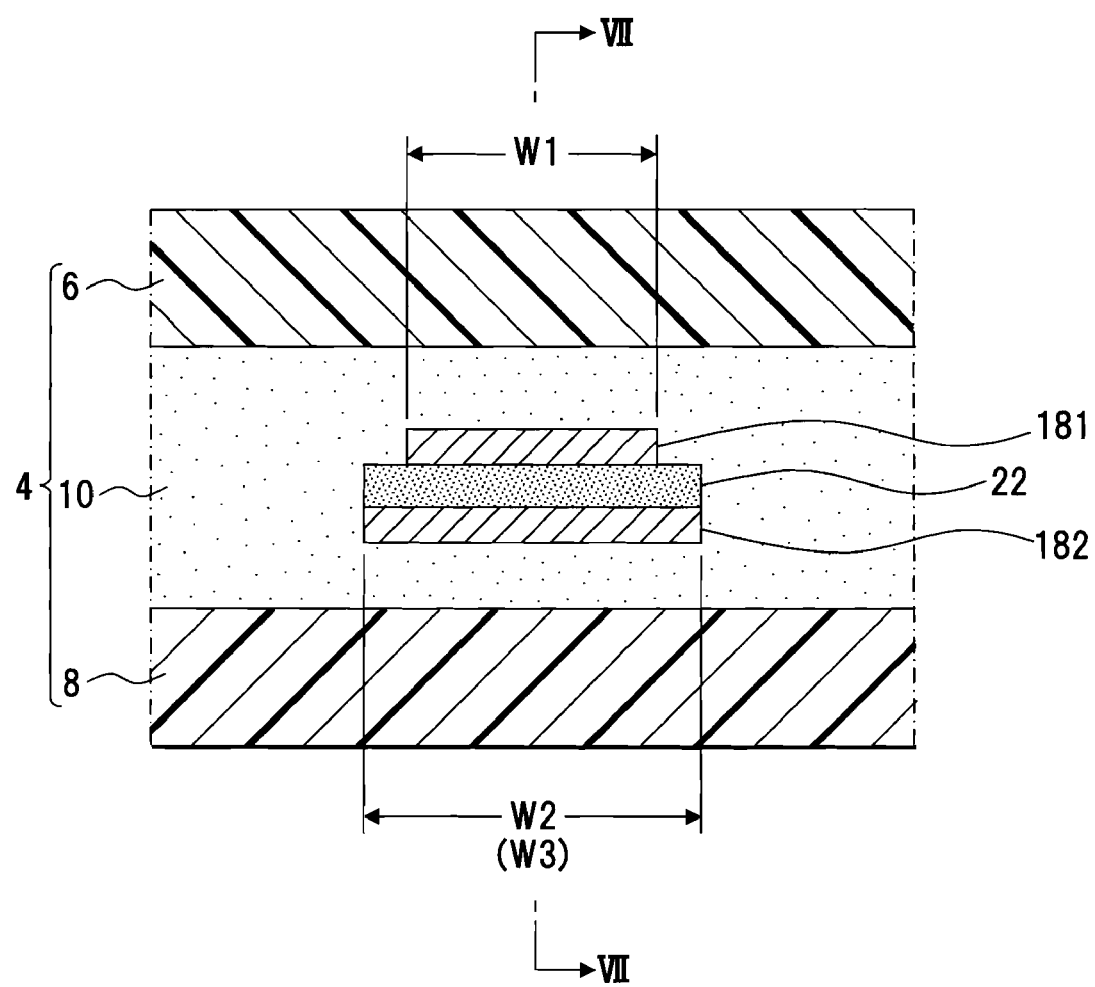
FIG. 6 is a cross-section diagram of a sealing structure of an electronic device according to a second embodiment.

Although the widths W1 and W2 of the flexible cables 181 and 182 are set to the same width (W1=W2) in the first embodiment, the widths may be W1<W2 as depicted in FIG. 6. In this case, the width W3 of the double-faced adhesive seat 22 may be the same as the width W2 of the flexible cable 182 (W3=W2).

Figure 7:
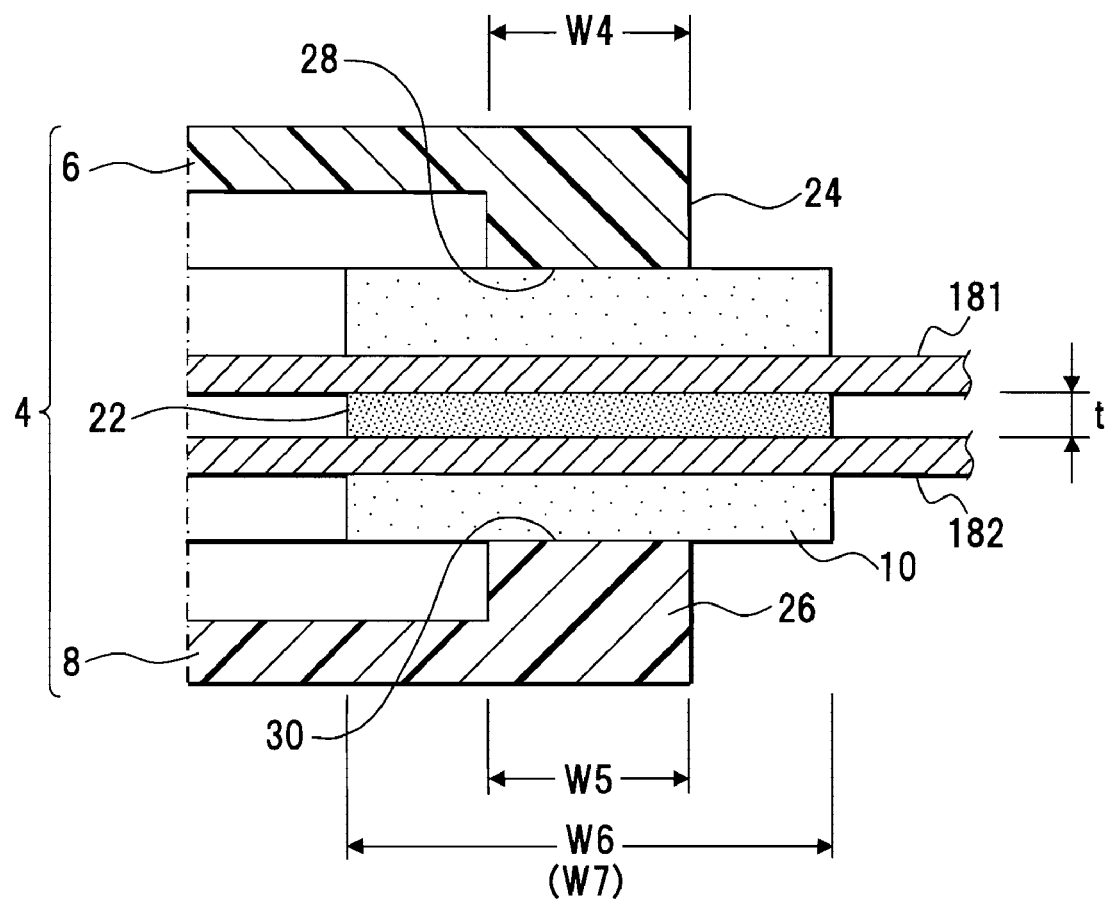
FIG. 7 is a cross-section diagram taken along line VII-VII of FIG. 6.

As depicted in FIG. 7, the lateral width W7 of the double-faced adhesive seat 22 may be set to the same width as the gasket 10 as in the case of the first embodiment. FIG. 7 is a cross-section diagram taken along line VII-VII of FIG. 6 and, in FIGS. 6 and 7, the portions same as FIGS. 1, 2, 3, 4 and 5A to 5D are denoted by The same reference numerals and the members will not be described.

Third Embodiment

Figure 8:
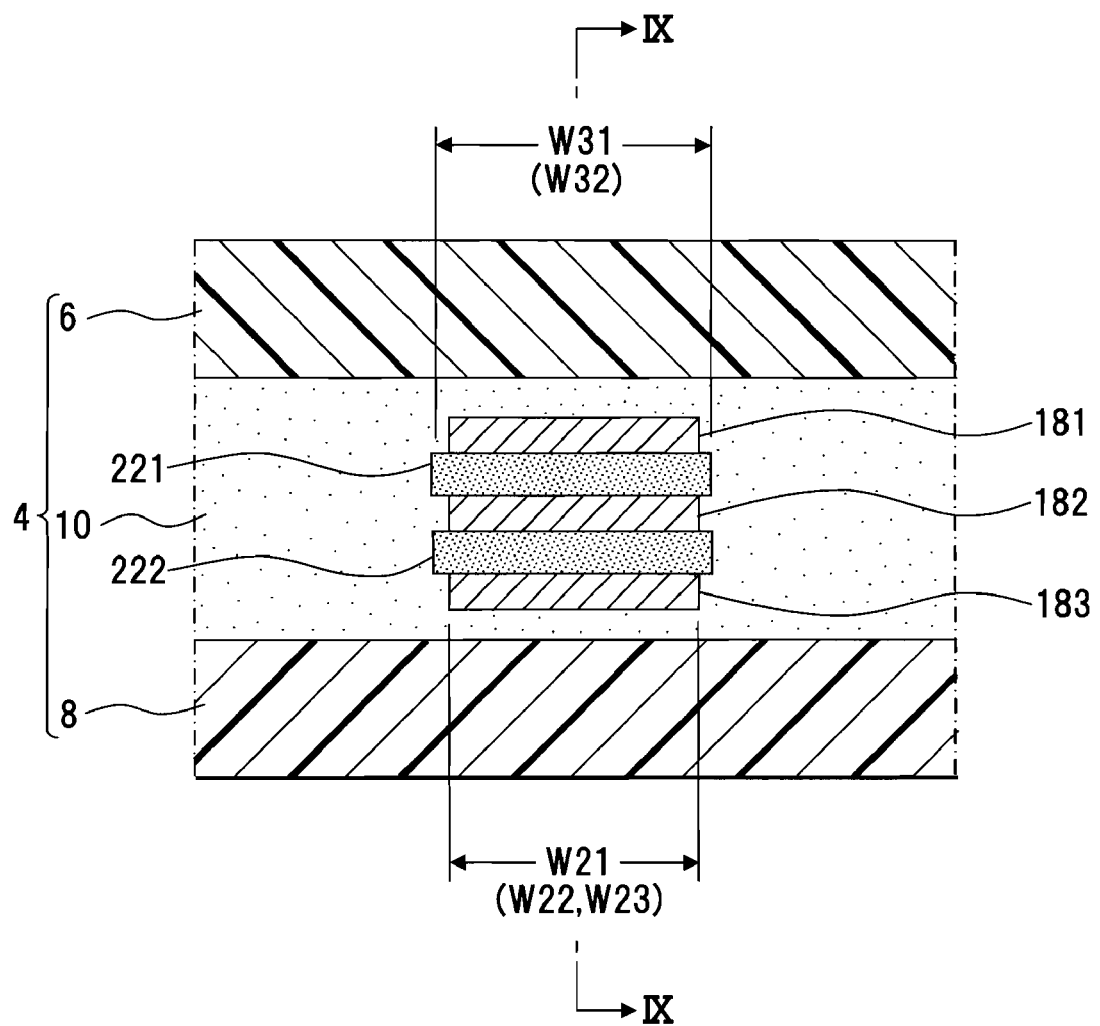
FIG. 8 is a cross-section diagram of a sealing structure of an electronic device according to a third embodiment.
Figure 9:
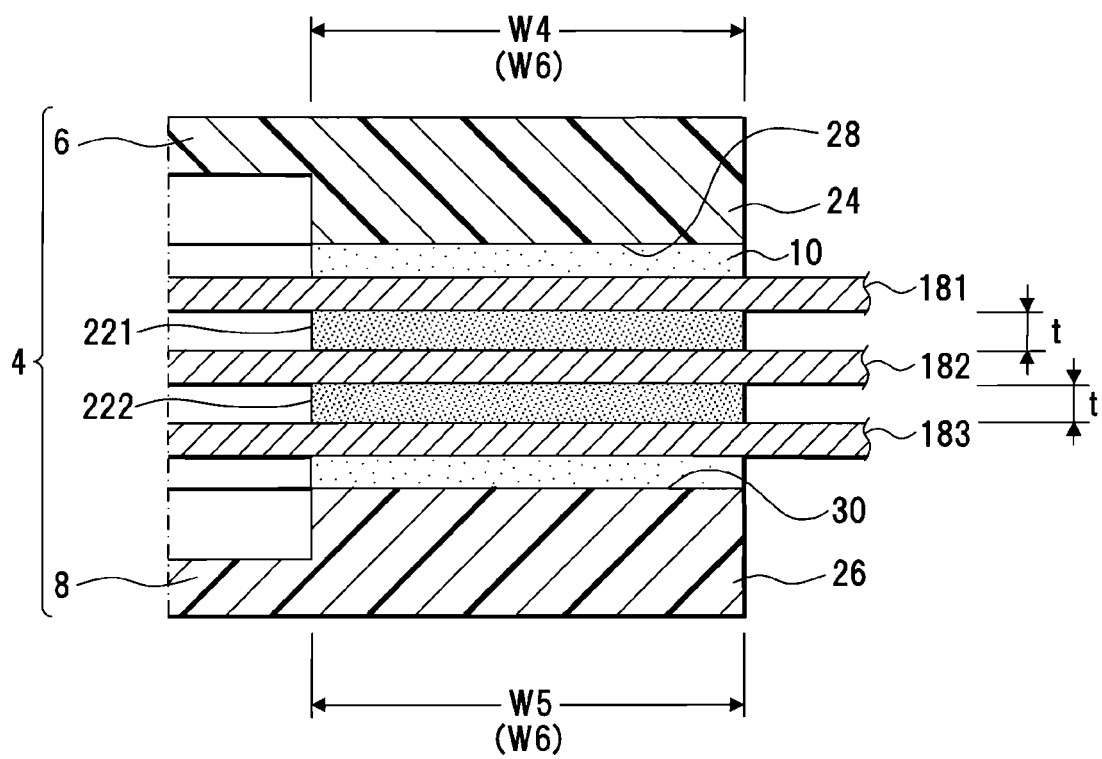
FIG. 9 is a cross-section diagram taken along line IX-IX of FIG. 8.

Although the flexible cables 181 and 182, i.e., the first and second cables are used as an example of at least two signal lines in the description of the first and second embodiments, three flexible cables 181, 182 and 183 may be combined as depicted in FIGS. 8 and 9. FIG. 8 is a cross-section diagram corresponding to FIG. 3 or 6, and FIG. 9 is a cross-section diagram taken along line IX-IX of FIG. 8.

In this case, a double-faced adhesive seat 221 overlapped between the flexible cable 181 and the flexible cable 182 and a double-faced adhesive seat 222 overlapped between the flexible cable 182 and the flexible cable 183 are bonded to combine the flexible cables 181, 182 and 183 by the double-faced adhesive seats 221 and 222. When W21, W22 and W23 denote the widths of the flexible cables 181, 182 and 183, respectively, and W31 and W32 denote the widths of the double-faced adhesive seats 221 and 222, respectively, if the widths W31 and W32 are set to a width greater than the widths W21, W22 and W23 {W31 (W32)>W21 (W22 or W23)}, the adhesive strength of the flexible cables 181, 182 and 183 may be enhanced, and the double-faced adhesive seats 221 and 222 exposed from the combined flexible cables 181, 182 and 183 may be brought into close contact with the gasket 10 to enhance the air-tightness.

Although the widths W21, W22 and W23 of the flexible cables 181, 182 and 183 are set to the same width (W21=W22=W23), the widths may be different (W21≠W22≠W23), and the widths W31 and W32 of the double-faced adhesive seats 221 and 222 are not necessarily the same (W31=W32) and may be different (W31≠W32).

Although the width W6 of the gasket 10 is set greater than each of the widths W4 and W5 of the rising wall 24 of the upper case 6 and the rising wall 26 of the lower case 8 in the first and second embodiments, the width may be set to the same width as depicted in FIG. 9. Other constituent elements are the same as the first embodiment and will not be described.

Fourth Embodiment

Figure 10:
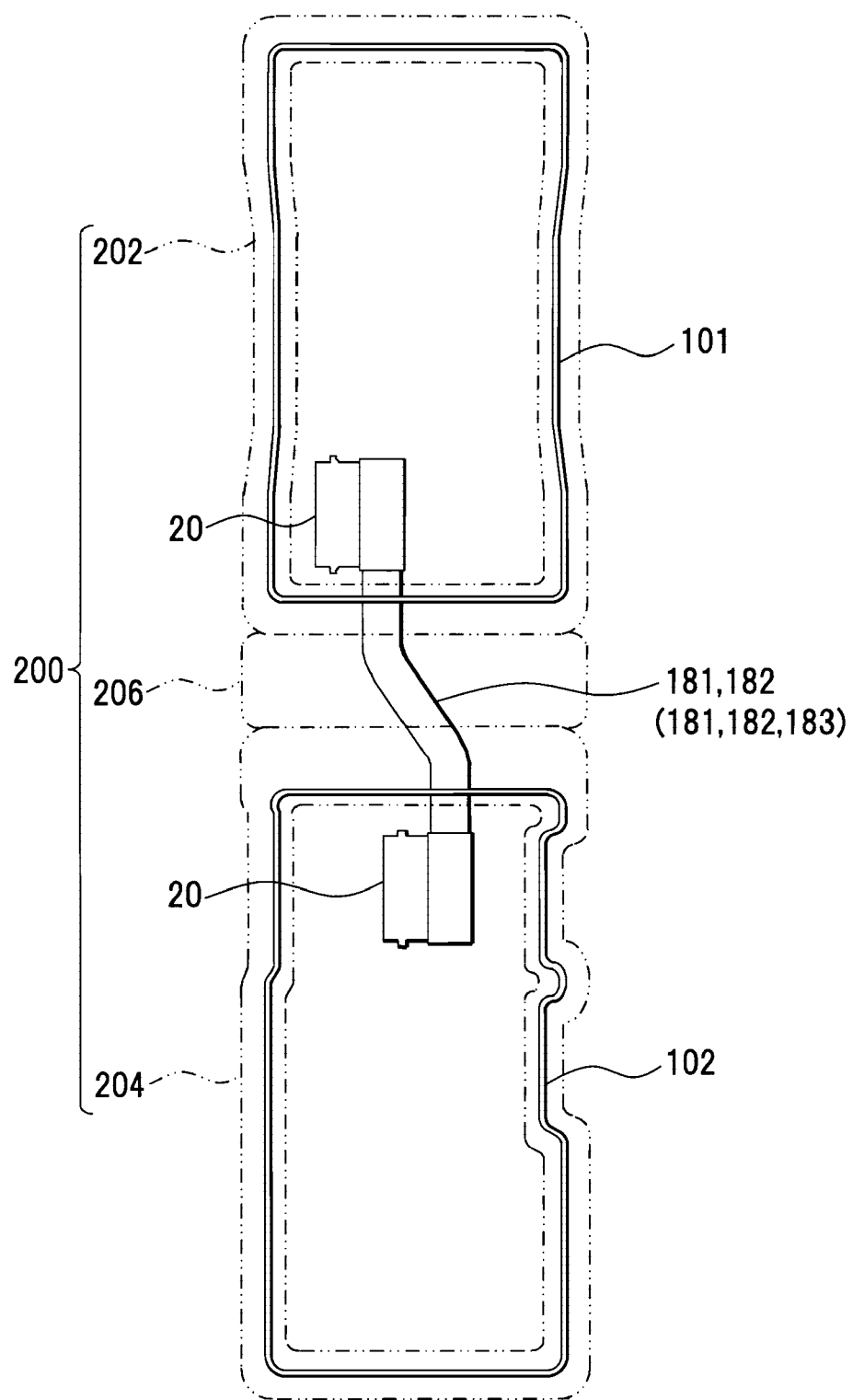
FIG. 10 is a diagram of an integral structure of signal lines and gaskets according to a fourth embodiment.

Although the case of using the circumferential-shaped single gasket 10 has been described in the above embodiments, a fourth embodiment may be configured by allowing penetration of the flexible cables 181 and 182 or the flexible cables 181, 182 and 183 between a plurality of gaskets 101 and 102 as depicted in FIG. 10 to combine a plurality of the gaskets 101 and 102 and the signal lines. FIG. 10 depicts the integral structure of the described sealing structures (gaskets) and the flexible cables. In FIG. 10, the portions same as FIG. 2 are denoted by the same reference numerals.

With such an integral structure of the flexible cables 181 and 182 (or 181, 182 and 183) and the gaskets 101 and 102, an electronic device, for example, a portable apparatus 200 is disposed with the gasket 101 on a case unit 202 and the gasket 102 on a case unit 204 and is disposed with the flexible cables 181 and 182 over a hinge unit 206 to maintain the air-tightness of the case units 202 and 204 and to enable connection between circuit units of the case units 202 and 204 through the flexible cables 181 and 182.

Fifth Embodiment

Figure 11:
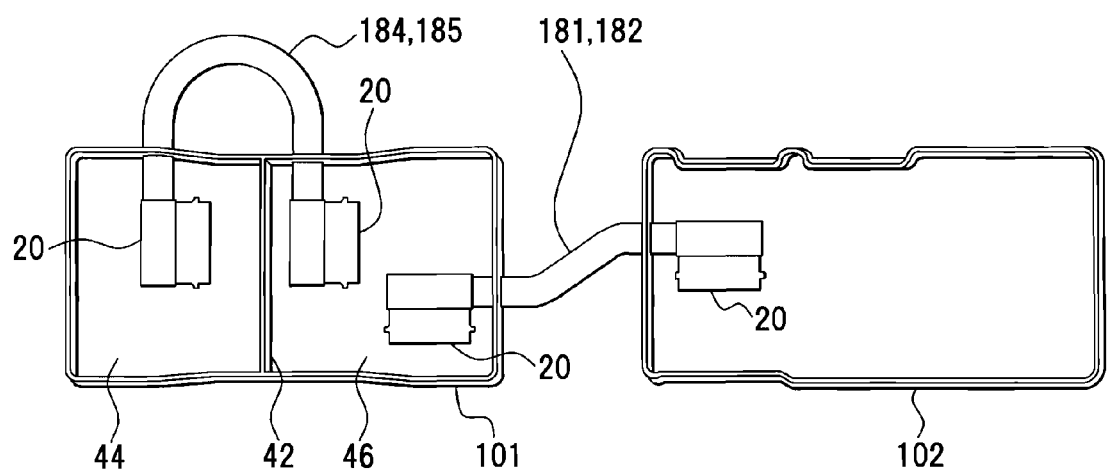
FIG. 11 is a diagram of an integral structure of signal lines and gaskets according to a fifth embodiment.

Although the above embodiments have the sealing structure that forms a single sealed space with the one gasket 10 or the gaskets 101 and 120, a fifth embodiment may have a configuration including a separation wall 42 formed on the gasket 101 to form two independent sealed spaces 44 and 46 in the gasket 101, and flexible cables 184 and 185 disposed across the sealed spaces 44 and 46 as depicted in FIG. 11. FIG. 11 depicts the integral structure of the sealing structures and the flexible cables according to the fifth embodiment and, in this embodiment, the portions same as the fourth embodiment (FIG. 10) are denoted by the same reference numerals and will not be described.

Other Embodiments (1) Although the double-faced adhesive seat 22 is exemplarily illustrated as an adhesive material for combining the flexible cables 181, 182, etc., in the above embodiments, a sticky material may be used instead of the double-faced adhesive seat 22 and if the sticky material is used, the portion of the double-faced adhesive seat 22 depicted in the embodiments represents a sticky material layer or an adhesive material layer.

Figure 12:
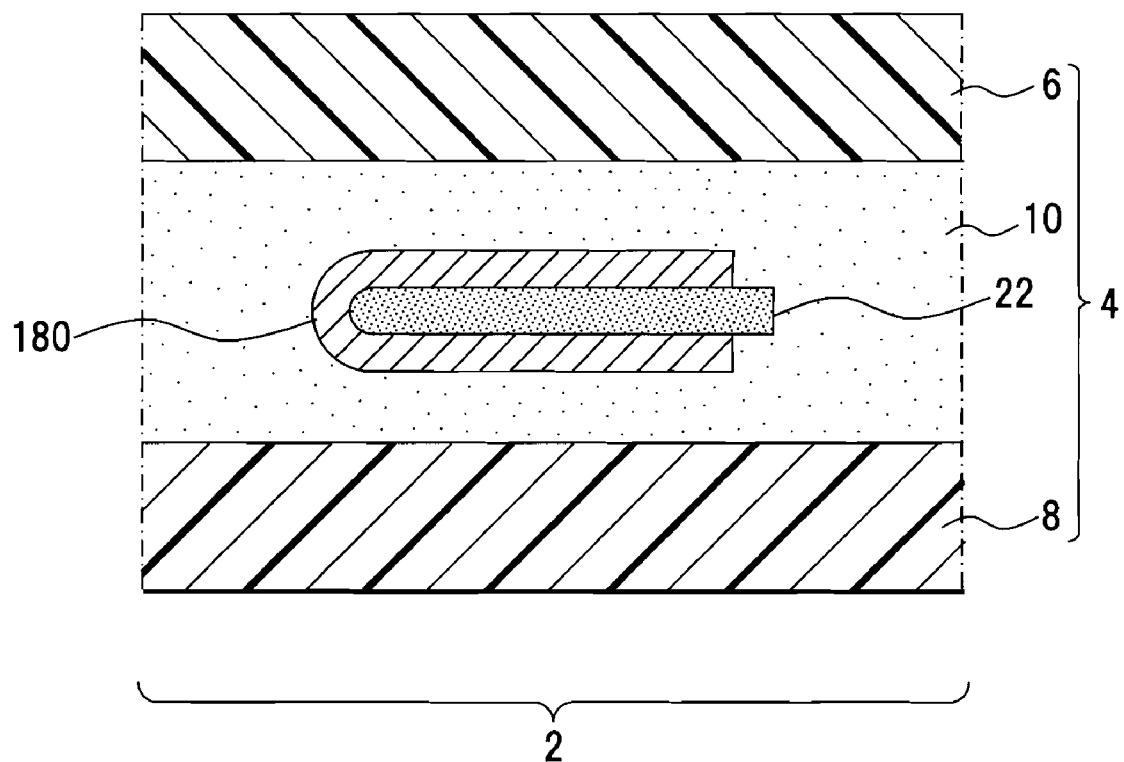
FIG. 12 is a diagram of an integral structure of a signal line and a gasket according to other embodiments.

(2) Although the case of using a plurality of the flexible cables 181, 182, etc., has been described in the above embodiments, the present invention is applicable to the case of using a single flexible cable 180 as depicted in FIG. 12. FIG. 12 is a cross-section diagram corresponding to FIG. 3 and the same portions are denoted by the same reference numerals. In this case, the single flexible cable 180 is bent and folded at the intermediate portion to overlap the double-faced adhesive seat 22 therein to allow penetration of the wide flexible cable 180 narrowed to a half width through the gasket 10. With such a configuration, the gasket 10 may be penetrated and the air-tightness may be retained in the same way.

Figure 13:
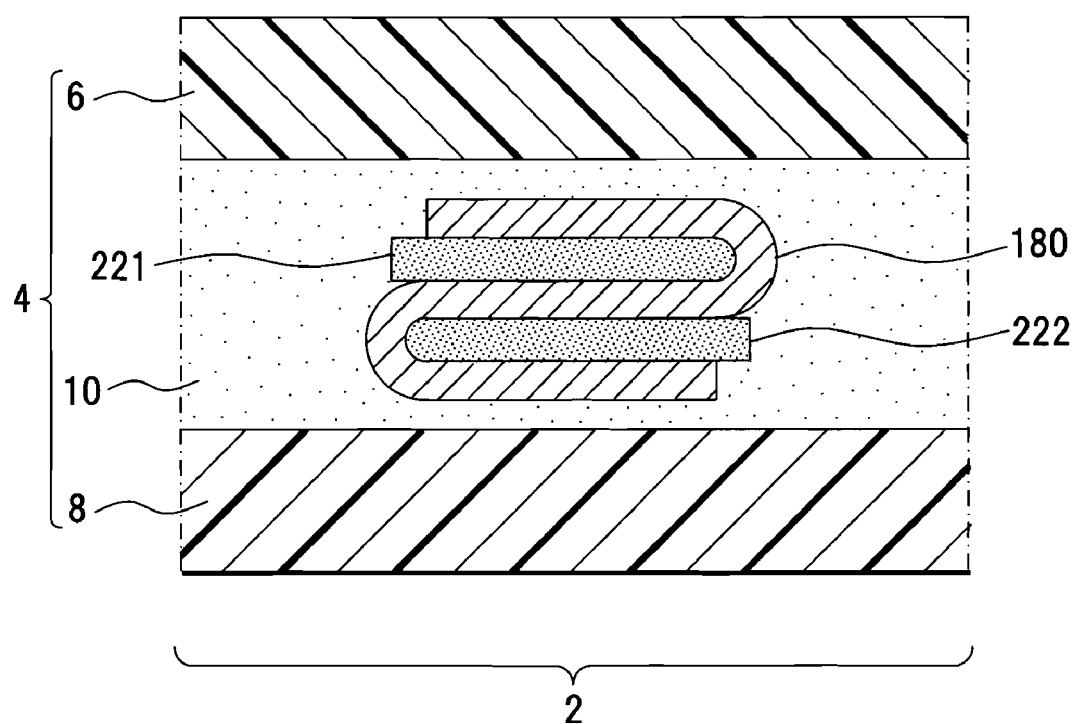
FIG. 13 is a diagram of an integral structure of a signal line and a gasket according to other embodiments.

(3) The flexible cable 180 may be folded into a zigzag shape to overlap a plurality of the double-faced adhesive seats 221 and 222 to allow penetration of the wide flexible cable 180 narrowed to one-third width through the gasket 10 as depicted in FIG. 13.

EXAMPLES

First Example

Figure 14:
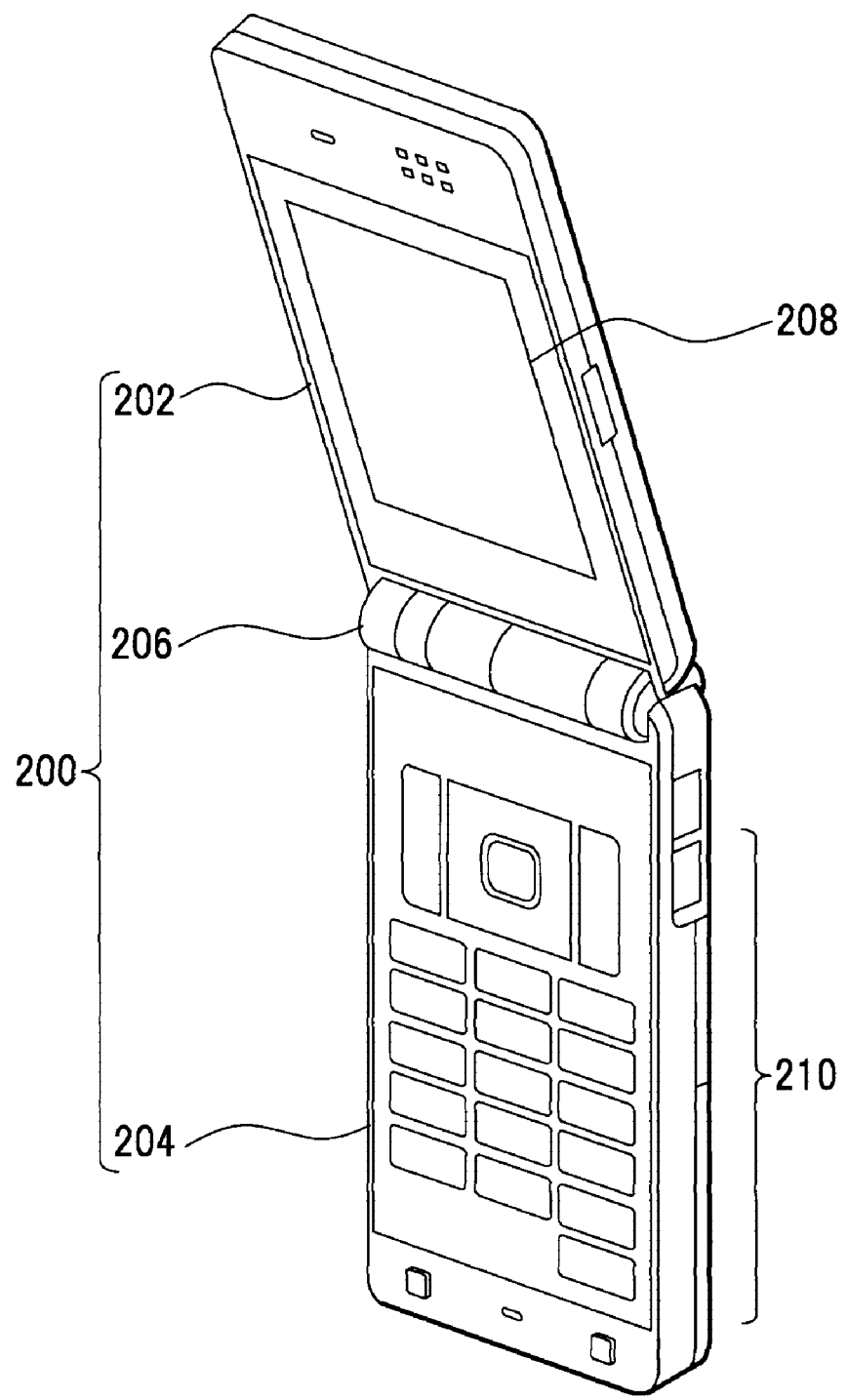
FIG. 14 is a diagram of a portable apparatus according to a first example.
Figure 15:
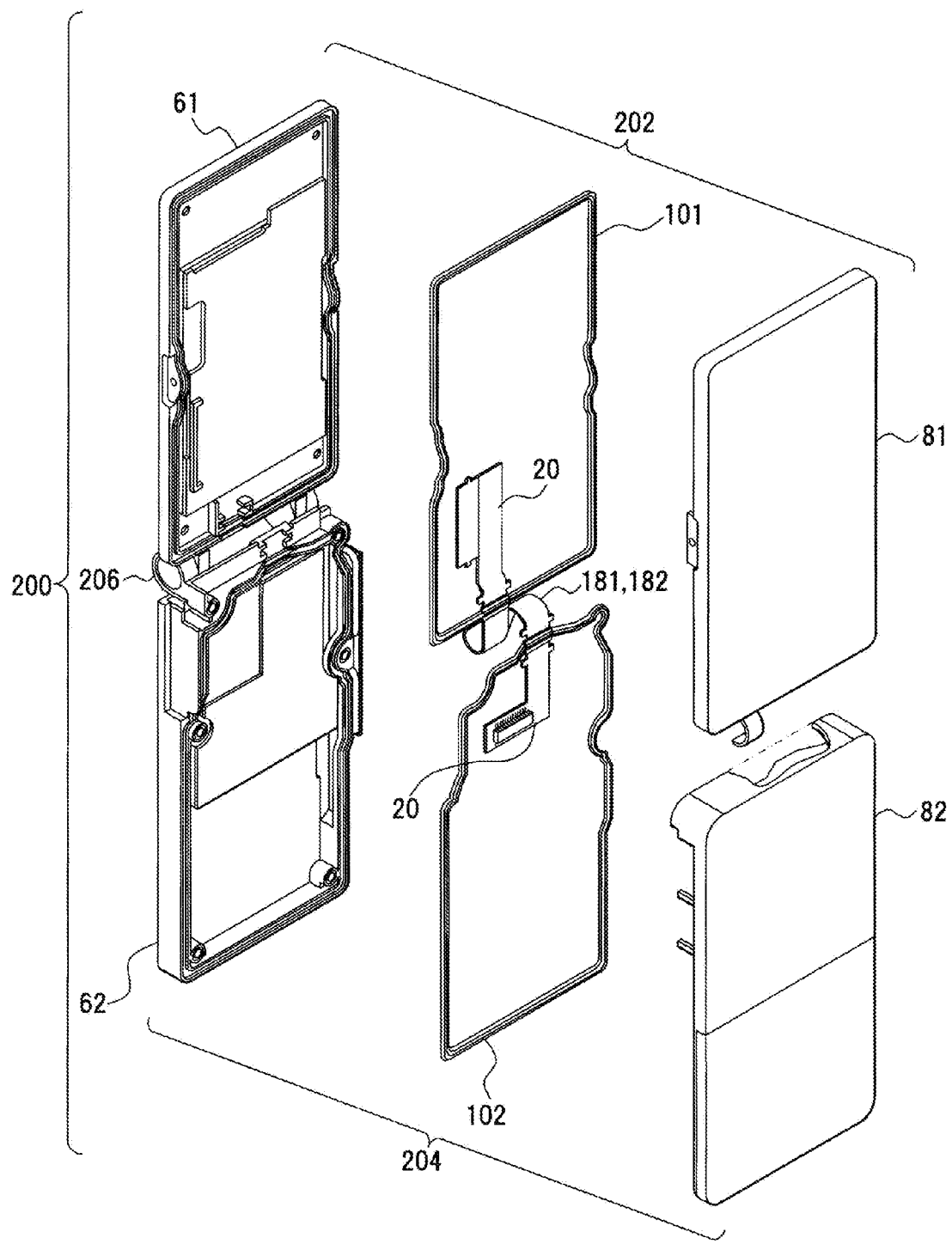
FIG. 15 is an exploded perspective view of the portable apparatus.

A first example of the present invention will be described with reference to FIGS. 14 and 15. FIG. 14 is a perspective view of an example of a portable apparatus and FIG. 15 is an exploded perspective view of the portable apparatus. In FIGS. 14 and 15, the portions same as FIG. 10 are denoted by the same reference numerals.

The portable apparatus 200 is, for example, a portable telephone and is configured in an openable/closable manner by coupling the case unit 202 and the case unit 204 with the hinge unit 206 as depicted in FIG. 14. The case unit 202 is provided with a displaying unit 208 made up of an LCD (liquid crystal display), etc., and the case unit 204 is provided with an operation input unit 210 including a plurality of keys. As depicted in FIG. 15, the case unit 202 is made up of an upper case 61 and a lower case 81 and the case unit 204 is made up of an upper case 62 and a lower case 82. In this example, the case unit 202 is disposed with the gasket 101 and the case unit 204 is disposed with the gasket 102 as in the fourth embodiment (FIG. 10). The gaskets 101 and 102 are penetrated by the flexible cables 181 and 182 and the flexible cables 181 and 182 between the gaskets 101 and 102, respectively, are rolled in a circle and disposed within the hinge unit 206.

Since the gaskets 101 and 102 form an integral structure with the flexible cables 181 and 182 in such a configuration, the integral structure may be handled as a single wiring component or gasket and may achieve the reduction of the number of parts, the retention of air-tightness such as the prevention of entry of water and dust into the case units 202 and 204, and the electric connection and the signal transmission through the flexible cables 181 and 182.

Second Example

Figure 16:
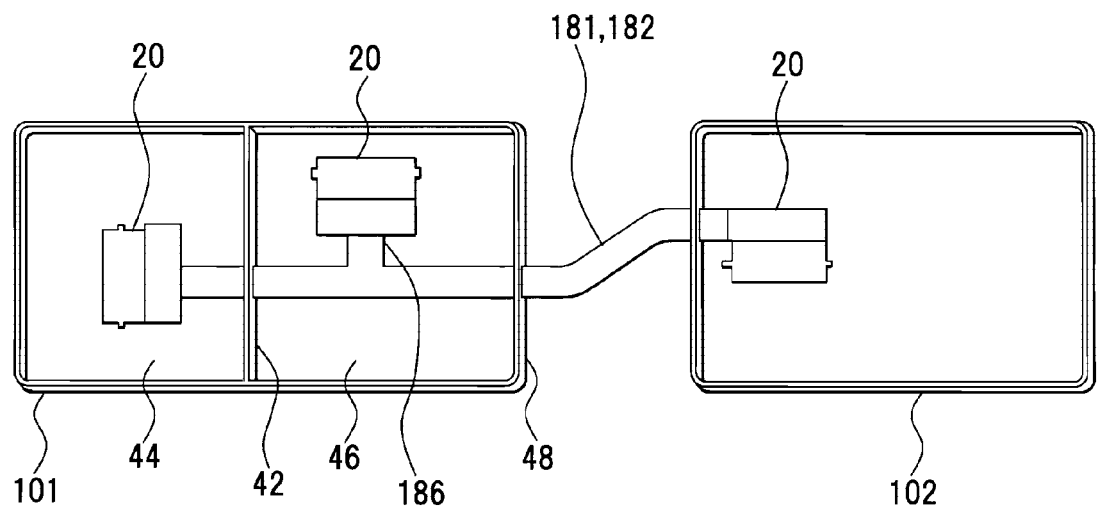
FIG. 16 is a diagram of an integral structure of signal lines and gaskets according to a second example.

In a second example, as depicted in FIG. 16, the separation wall 42 is formed on the gasket 101 to form the sealed spaces 44 and 46 as in the fifth embodiment (FIG. 11); the flexible cables 181 and 182 are disposed to penetrate the separation wall 42 from a rising wall 48 of the sealed space 46; a branching portion 186 is formed at an intermediate portion of the flexible cables 181 and 182; and the connector 20 is formed for the branching portion 186. Such a configuration enables the electric connection and the signal transmission while maintaining the air-tightness among the circuit substrate on the gasket 102 and the circuit substrates disposed in the sealed spaces 44 and 46 on the gasket 101.

Third Example

Figure 17:
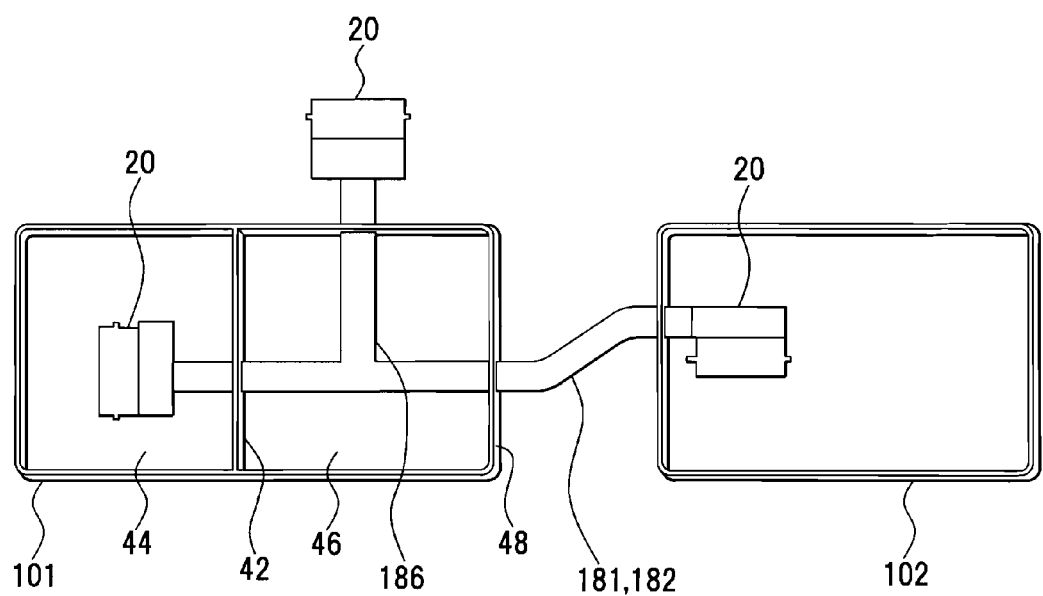
FIG. 17 is a diagram of an integral structure of signal lines and gaskets according to a third example.

In a third example, as depicted in FIG. 17, the separation wall 42 is formed on the gasket 101 to partition the sealed spaces 44 and 46 as in the second example (FIG. 16) and the branching portion 186 of the flexible cables 181 and 182 is allowed to penetrate the gasket 101 and drawn out of the sealed space 46. Such a configuration also enables the electric connection and the signal transmission while maintaining the air-tightness among the circuit substrate on the gasket 102 and the circuit substrate disposed in the sealed space 44 on the gasket 101 and an electronic device on the outside of the sealed space 46.

Fourth Example

Figure 18:
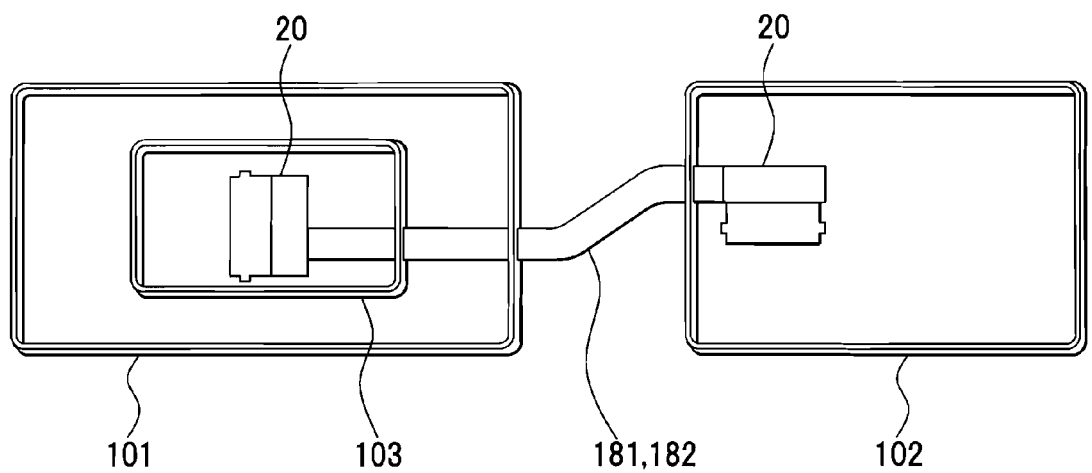
FIG. 18 is a diagram of an integral structure of signal lines and gaskets according to a fourth example.

In a fourth example, as depicted in FIG. 18, a gasket 103 is disposed within the gasket 101 so that the sealing structure of the gasket 101 is multiplexed by the gaskets 101 and 103, and the flexible cables 181 and 182 are disposed to penetrate the gaskets 101 and 103. In FIG. 18, the portions same as the first example (FIG. 15) are denoted by the same reference numerals.

Because of the multiplexed structure of the gasket such as the gaskets 101 and 103, the degree of air-tightness may be increased for preventing the entry of water and dust into the gasket 103.

Fifth Example

Figure 19:
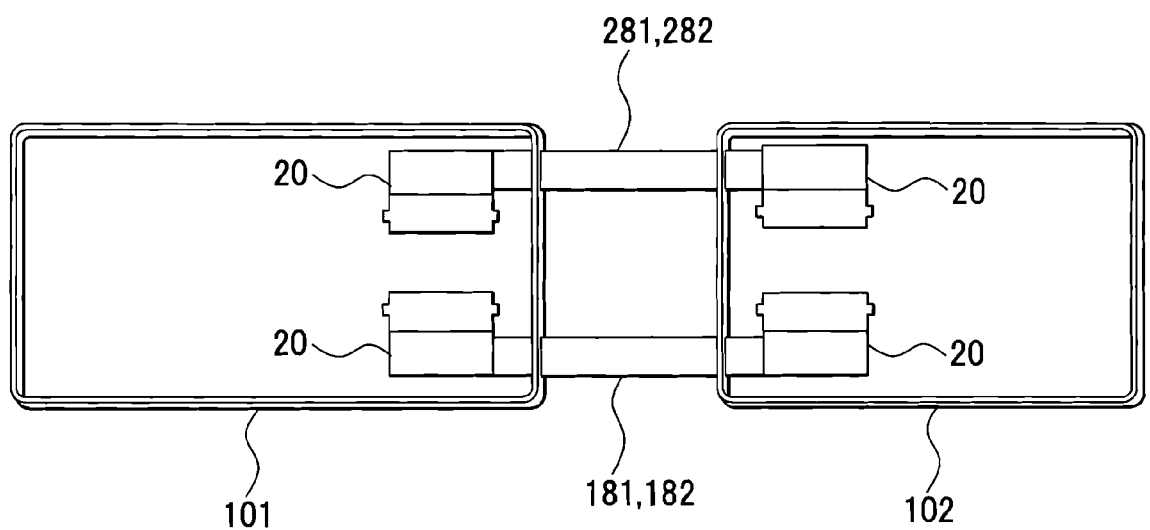
FIG. 19 is a diagram of an integral structure of signal lines and gaskets according to a fifth example.

Although the unified flexible cables 181 and 182 are allowed to penetrate through the gaskets 101 and 102 at one position in the first example (FIG. 15), a plurality of signal lines are allowed to penetrate the gaskets 101 and 102 at a plurality of positions by allowing penetration of other flexible cables 281 and 282 for the unified flexible cables 181 and 182 as depicted in FIG. 19 in a fifth example.

As described in the first example, when the above sealing structure is employed, the air-tightness is not impaired and the electric connection and the signal transmission are enabled even if the signal lines are configured to penetrate the gaskets 101 and 102 at a plurality of positions.

Sixth Example

Figure 20:
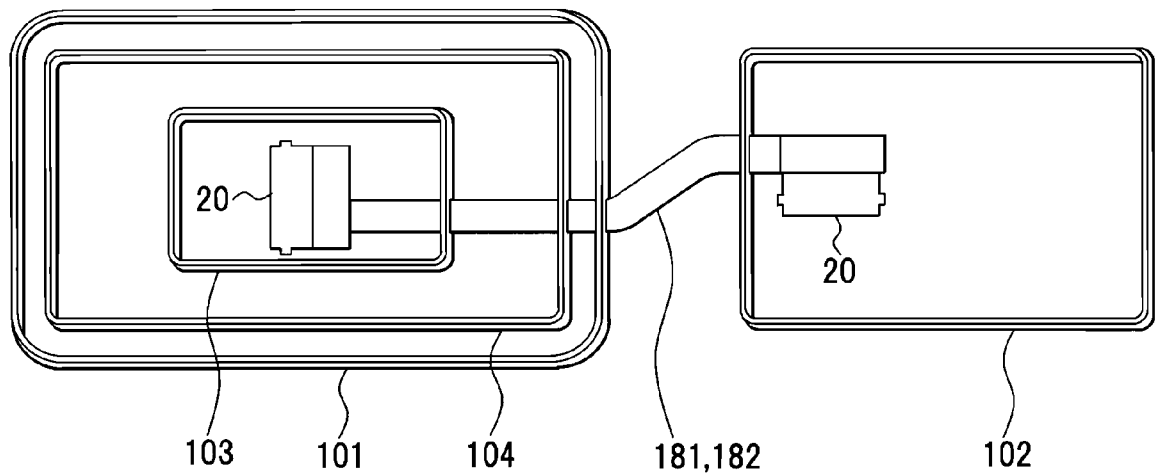
FIG. 20 is a diagram of an integral structure of signal lines and gaskets according to a six example.

In a sixth example, as depicted in FIG. 20, a gasket 104 is added to the fourth example (FIG. 18) to multiplex the sealing structure. The sealing strength may be enhanced by tripling the gaskets 101, 103 and 104.

Seventh Example

Figure 21:
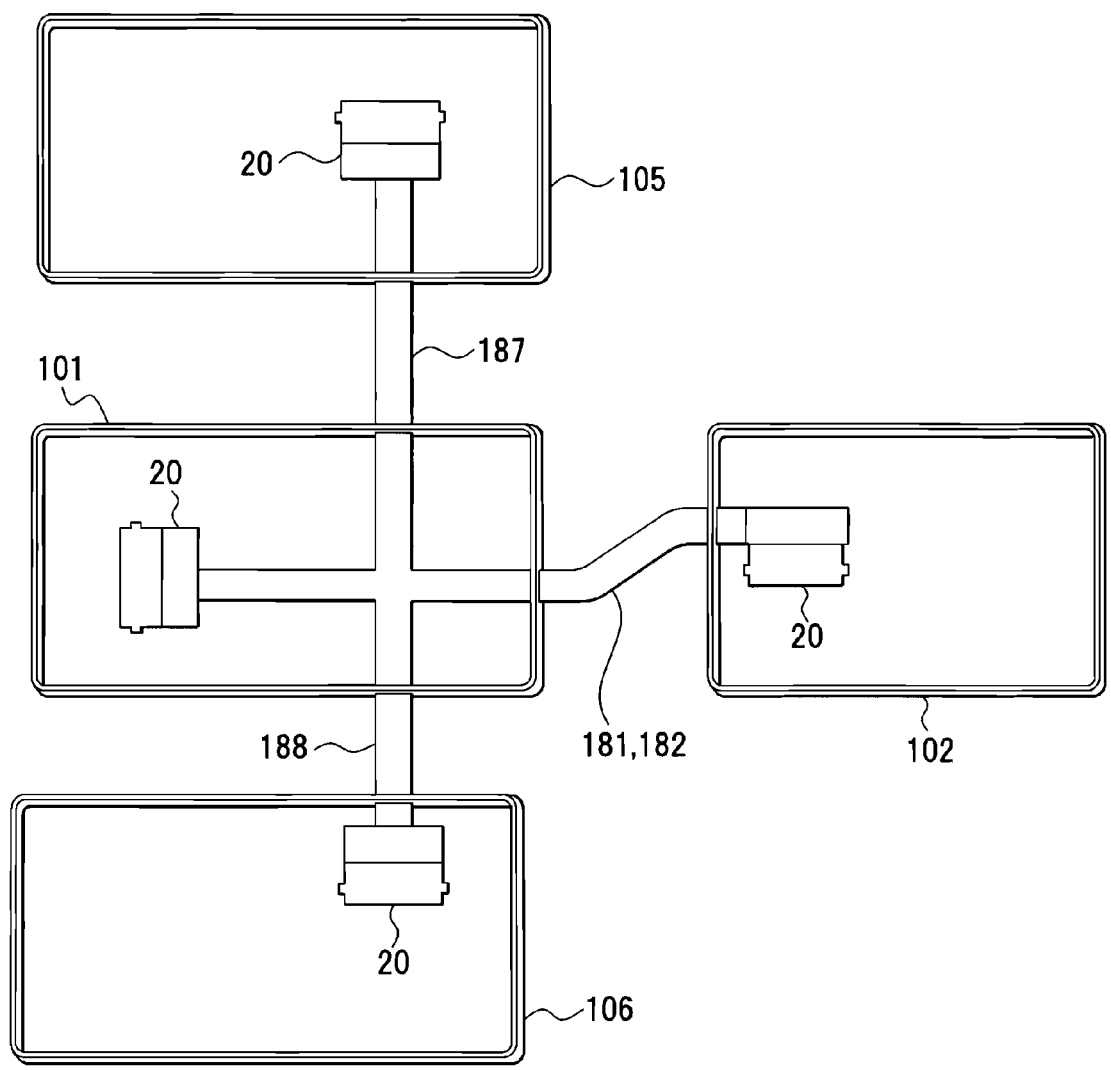
FIG. 21 is a diagram of an integral structure of signal lines and gaskets according to a seventh example.

In a seventh example, as depicted in FIG. 21, a plurality of gaskets 101, 102, 105 and 106 are arranged and the flexible cables 181 and 182 penetrating the gaskets 101 and 102 are branched in the gasket 101 to allow branched cables 187 and 188 to penetrate the gaskets 105 and 106. When the gaskets are individually disposed for the variously branched cables on the connecting portion sides of the cables, a plurality of sealed spaces may be formed in a plurality of devices or a single device to support various device forms.

Eighth Example

Figure 22:
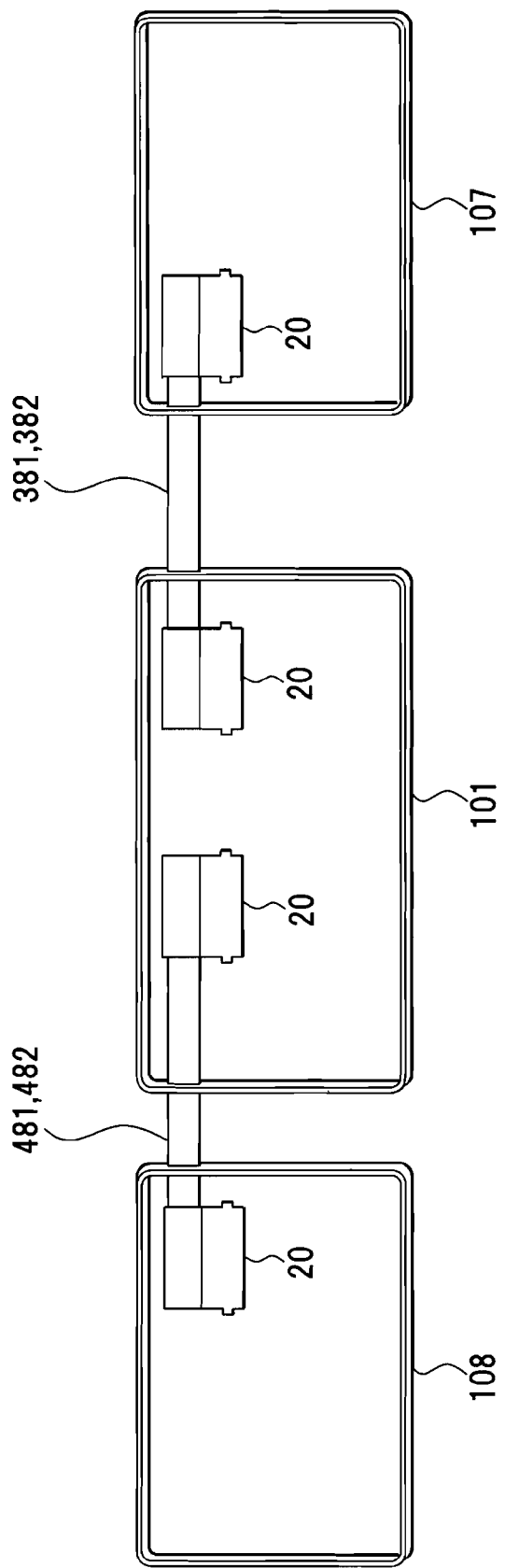
FIG. 22 is a diagram of an integral structure of signal lines and gaskets according to an eighth example.

Although the radial branching form of the flexible cables 187 and 188 centering on the gasket 101 has been described in the seventh example, gaskets 107 and 108 are disposed for the gasket 101 to dispose flexible cables 381 and 382 as first signal lines between the gasket 101 and the gasket 107 and flexible cables 481 and 482 as second signal lines between the gasket 101 and the gasket 108 in a penetrating manner as depicted in FIG. 22 in an eighth example.

With such a configuration, the circuit substrates disposed on the gaskets 101, 107 and 108 may serially be connected by the flexible cables 381, 382, 481 and 482 to retain the air-tightness of the respective gaskets and achieve the electric connection and the signal transmission.

Other Examples

Figure 23:
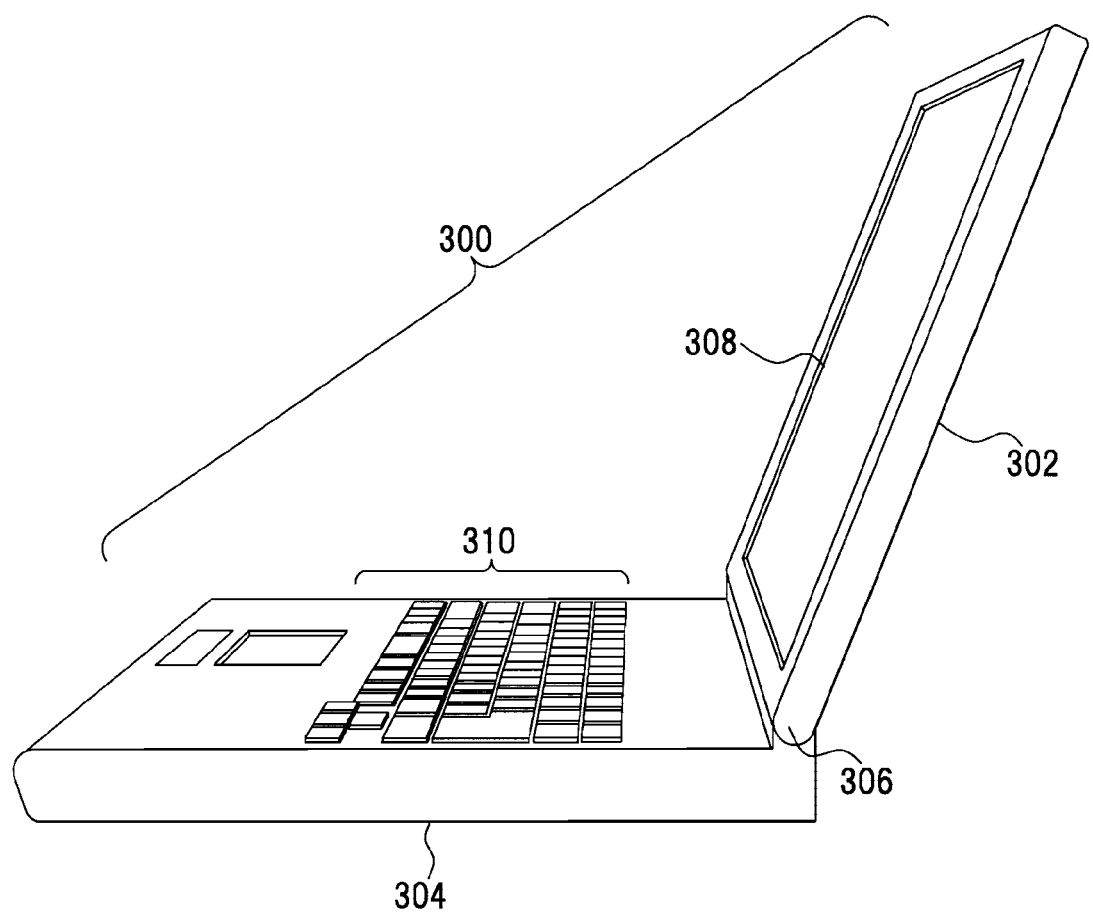
FIG. 23 is a diagram of a personal computer according to other examples.

Although an electronic device and a portable telephone are exemplarily illustrated as a portable apparatus in the above embodiments and examples, the present invention is applicable to a personal computer (PC) as depicted in FIG. 23. That is, a PC 300 includes a case unit 302 and a case unit 304 coupled with a hinge unit 306 in an openable/closable manner; the case unit 302 is disposed with an LCD displaying unit 308; and the case unit 304 is disposed with an operation input unit 310. In the PC 300, gaskets are individually disposed in the case unit 302 and the case unit 304 and the sealing structures may be implemented in the same way as the first embodiment to achieve the air-tightness of the case units 302 and 304 and the electric connection and the signal transmission between the circuit substrates disposed in the case units 302 and 304.

Figure 24:
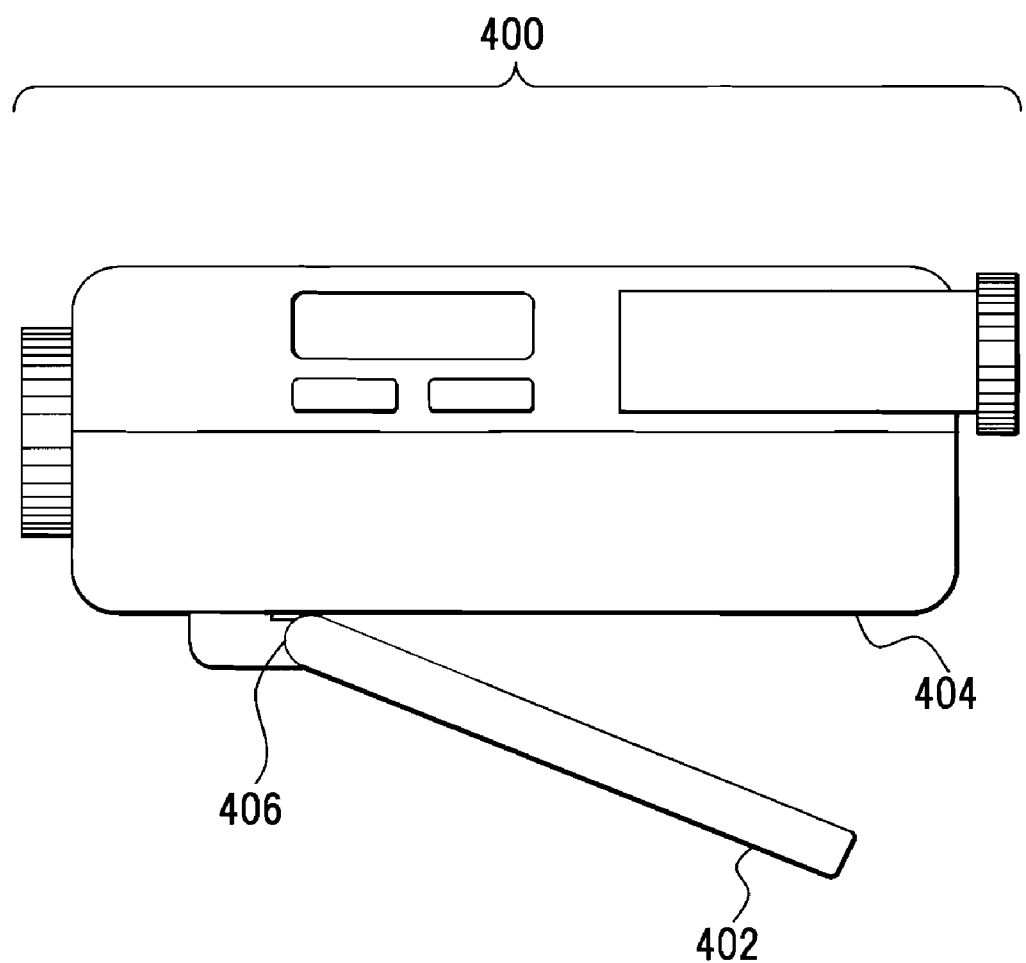
FIG. 24 is a diagram of a video camera according to other examples.

The present invention is applicable to a video camera, etc., as depicted in FIG. 24. That is, a video camera 400 includes a case unit 402 and a case unit 404 coupled with a hinge unit 406 in an openable/closable manner; the case unit 402 is disposed with an LCD displaying unit; and the case unit 404 is disposed with an operation input unit, etc. In the video camera 400, gaskets are individually disposed in the case unit 402 and the case unit 404 and the sealing structure may be implemented in the same way as the first embodiment to achieve the air-tightness of the case units 402 and 404 and the electric connection and the signal transmission between the circuit substrates disposed in the case units 402 and 404.

Although the sealing structure of the gasket using the two flexible cables 181 and 182 is exemplarily illustrated in the above examples, the present invention may use a single flexible cable or a plurality of flexible cables.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

Technical ideas extracted from the embodiments of the present invention described above will then be listed. The technical ideas of the present invention may be comprehended at various levels and variations ranging from higher to lower conceptions and the present invention is not limited to the following description.

A sealing structure to seal housings includes a sealing member disposed between housings to be bonded to allow penetration of at least one signal line, and an adhesive material disposed between the signal lines penetrating the sealing member to bond the signal lines to be overlapped.

With such a configuration, since at least two signal lines bonded by the adhesive material or one signal line folded and bonded by the adhesive material are covered by the sealing member and are disposed along with the sealing member and drawn out between the housings, the housings may be sealed and the signal lines may be allowed to pass through the sealed portion. In this case, the air-tightness is retained by the adhesive material at the bonding portion of the signal lines and the air-tightness is retained by the sealing member in portions other than the bonding portion of the signal lines.

In the above sealing structure, preferably, the adhesive material may have a width same as or different from the width of the signal lines, the signal line may be arranged in the direction crossing the sealing member, the signal line may have a plate shape with a width greater than the thickness thereof and may be arranged with plate surfaces thereof facing the compression direction of the sealing member, the signal line may be a flat cable, the adhesive material may be a sticky material or a double-faced adhesive seat, and the sealing member may be provided at one end or both ends of the signal line.

A gasket includes the above sealing structure.

An electronic device includes the above sealing structure.

An electronic device includes the above gasket.

An electronic device includes a housing unit to include a first housing and a second housing bonded with the first housing, a circuit unit disposed in the housing unit, a first cable and a second cable connected to the circuit unit and drawn out of the housing unit, a sealing member provided between the first housing and the second housing and penetrated by the first cable and the second cable, and an adhesive material provided between the first cable and the second cable to bond the first cable and the second cable to be overlapped.

With such a configuration, since the sealing between the first and second housings is implemented by the sealing member and the first and second cables are allowed to pass through the sealing portion with the first and second cables bonded by the adhesive material, the air-tightness is retained by the adhesive material at the bonding portion of the first and second cables and the air-tightness is retained by the sealing member in portions other than the bonding portion of the first and second cables.

A sealing method to seal housings includes overlapping signal lines to be disposed between housings to bond the signal lines with an adhesive material, and allowing penetration of the bonded signal lines through a sealing member to dispose the sealing member between the housings.

A manufacturing method of a gasket to seal housings includes disposing an adhesive material between signal lines in an overlapped manner to bond the signal lines, and forming a sealing member allowing penetration of the bonded signal lines.

Effects of the embodiments of the present invention will be listed as follows.

(1) According to the embodiments of the present invention, waterproof and air-tightness may be acquired that are necessary for a portable apparatus and an electronic device on a daily basis, and a stable waterproof function and air-tightness may be acquired, contributing to miniaturization and flattening of the portable apparatus and the electronic device.

(2) According to the embodiments of the present invention, the sealing member and the signal line disposed between the housings may be formed into the integral structure to acquire waterproof and air-tightness of the housing unit of the portable apparatus or the electronic device and the signal line may be allowed to penetrate the sealing portion.

(3) The gasket and the signal line disposed between the housings may be formed into the integral structure to acquire waterproof and air-tightness of the housing unit of the portable apparatus or the electronic device and the signal line may be drawn out by allowing penetration through the sealing portion.

(4) Since the bonding portion of the signal lines may be positioned at the integrated portion of the signal lines and the sealing member or the gasket, the occupying dimensions of the signal lines may be minimized in the width direction and the thickness direction for the sealing member or the gasket.

(5) Since the at least two signal lines are bonded with the adhesive material overlapped between the signal lines and sealed by the adhesive material, higher air-tightness and waterproof ability may be acquired from the simple structure.

(6) If the adhesive material such as a double-faced adhesive seat is used, the sealing by the adhesive material may be acquired while minimizing the thickness of the overlapped signal lines, and the preprocessing for implementing the sealing structure or the gasket is facilitated to improve the productivity and to achieve reduction of manufacturing cost and product cost.

While the most preferred embodiments of the present invention have been described hereinabove, the present invention is not limited to the above embodiments, and it is a matter of course that various variations and modifications can be made by those skilled in the art within the scope of the claims without departing from the spirit of the invention disclosed herein, and needless to say, such variations and modifications are also encompassed in the scope of the present invention.

The present invention relates to a sealing structure, an electronic device, a sealing method, a gasket, and a manufacturing method thereof, which include sealing housings, and is useful since waterproof and air-tightness may be acquired that are necessary for a portable apparatus and an electronic device on a daily basis and a stable waterproof function and air-tightness may be acquired, contributing to miniaturization and flattening of the portable apparatus and the electronic device.

The invention claimed is:

1. A sealing structure to seal housings comprising:
 a sealing member disposed between housings to be bonded to allow penetration of signal lines; and
 an adhesive material disposed between the signal lines penetrating the sealing member to bond the signal lines to be overlapped, the adhesive material is disposed at a position where the signal lines and the sealing member are overlapped.

2. The sealing structure of claim 1, wherein the adhesive material has a width same as or different from a width of the signal lines.

3. The sealing structure of claim 1, wherein the signal line is arranged in a direction crossing the sealing member.

4. The sealing structure of claim 1, wherein the signal line has a plate shape with a width greater than a thickness thereof and is arranged with plate surfaces thereof facing a compression direction of the sealing member.

5. The sealing structure of claim 1, wherein the signal line is a flat cable.

6. The sealing structure of claim 1, wherein the adhesive material is a sticky material or a double-faced adhesive seat.

7. The sealing structure of claim 1, wherein the sealing member is provided at one end or both ends of the signal line.

8. A gasket comprising the sealing structure of claim 1.

9. An electronic device comprising the gasket of claim 8.

10. An electronic device comprising the sealing structure of claim 1.

11. An electronic device comprising:
 a housing unit to include a first housing and a second housing bonded with the first housing;
 a circuit unit disposed in the housing unit;
 a first cable and a second cable connected to the circuit unit and drawn out of the housing unit;
 a sealing member provided between the first housing and the second housing and penetrated by the first cable and the second cable; and
 an adhesive material provided between the first cable and the second cable to bond the first cable and the second cable at a position where the first cable, the second cable and the sealing member are overlapped.

12. A sealing method to seal housings comprising:
overlapping signal lines to be disposed between housings to bond the signal lines with an adhesive material; and
allowing of the bonded signal lines to penetrate a sealing member to dispose in the sealing member a portion where the signal lines are bonded with the adhesive material, and dispose the sealing member between the housings.

13. A manufacturing method of a gasket to seal housings comprising:
disposing an adhesive material between signal lines in an overlapped manner to bond the signal lines; and
forming a sealing member allowing penetration of the bonded signal lines,
wherein a portion where the signal lines are bonded with the adhesive material is disposed in the sealing member.

* * * * *